(12) United States Patent
Tsutsui

(10) Patent No.: US 7,676,048 B2
(45) Date of Patent: Mar. 9, 2010

(54) GRAPHIC EQUALIZERS

(75) Inventor: Ryo Tsutsui, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 1287 days.

(21) Appl. No.: 11/128,064

(22) Filed: May 11, 2005

(65) Prior Publication Data

US 2005/0254564 A1   Nov. 17, 2005

Related U.S. Application Data

(60) Provisional application No. 60/571,233, filed on May 14, 2004.

(51) Int. Cl.
*H03G 5/00* (2006.01)

(52) U.S. Cl. .................. 381/103; 381/98; 381/101; 333/28 R

(58) Field of Classification Search .................. 381/103, 381/98–99, 94.3, 101; 333/28 R, 28 T
See application file for complete search history.

(56) References Cited

U.S. PATENT DOCUMENTS

| 7,215,787 | B2 * | 5/2007 | Sternad et al. | 381/98 |
| 2004/0042625 | A1 * | 3/2004 | Brown | 381/103 |
| 2004/0267520 | A1 * | 12/2004 | Holley, II | 704/201 |

\* cited by examiner

*Primary Examiner*—Xu Mei
*Assistant Examiner*—Disler Paul
(74) *Attorney, Agent, or Firm*—Mirna G. Abyad; Wade J. Brady, III; Frederick J. Telecky, Jr

(57) ABSTRACT

Graphic equalizer as a cascade of equalization filters with the gain of each individual filter compensated for the gain leakage from other filters. A linear approximation allows individual filter gains to be set to give desired frequency responses.

8 Claims, 2 Drawing Sheets

GRAPHIC EQUALIZERS

CROSS-REFERENCE TO RELATED APPLICATIONS

This application claims priority from provisional application No. 60/571,233, filed May 14, 2004.

BACKGROUND OF THE INVENTION

The present invention relates to digital signal processing, and more particularly to digital filters and methods.

Recorded music playback typically includes equalization filtering which can emphasize or attenuate frequency bands in order to improve the sound. A set of tunable equalization filters, each of which modifies a frequency band while leaving frequencies outside of the band unchanged, can be cascaded to provide graphic equalization filtering with control of the gains in the individual frequency bands; FIG. 4 shows generic functional blocks. A graphic equalizer may include a display of the power (gain) in each of the frequency bands; this allows easy user adjustments of the gains.

Regalia et al, Tunable Digital Frequency Response Equalization Filters, 35 IEEE Trans. Acoustics, Speech, and Signal Processing 118 (1987), Fontana et al, A Digtial Bandpass/Bandstop Complementary Equalization Filter with Independent Tuning Characteristics, 10 IEEE Signal Processing Lett. 119 (2003), and Bristow-Johnson, The Equivalence of Various Methods of Computing Biquad Coefficients for Audio Parametric Equalizers, Proc. Audio Eng. Soc. Conv. (November 1994) describe designs for individual tunable equalizer filters: first-order filters can be used for the high frequency and low frequency ends (shelf filters), and second-order filters can be used for the center bands (peak/notch filters). These filters provide single parameter (gain) control for each band and are cascaded to form a graphic (parametric) equalizer.

However, there is a problem of gain leakage among the adjacent bands in cascades of such individual equalization filters. Indeed, the magnitude response of one equalization filter will affect the responses of the other filters, and this "leak gain" affects the overall cascaded filter system response.

SUMMARY OF THE INVENTION

The present invention provides cascaded equalization filters with compensation for the leak gain among the filters by individual filter gain determination in terms of desired gains.

DESCRIPTION OF THE PREFERRED EMBODIMENTS

1. Overview

Figure 1:
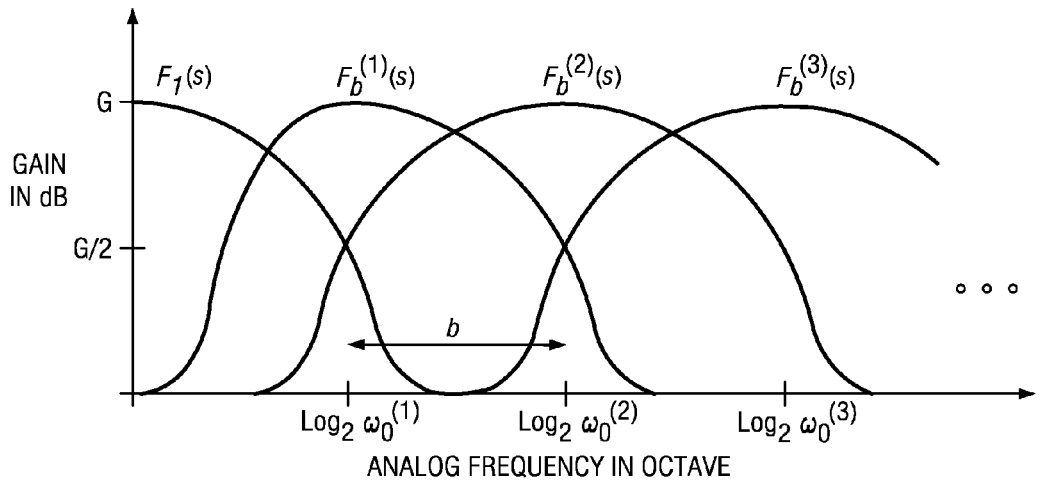
FIG. 1 shows equalization filter overlap.

Preferred embodiment graphic equalizers use cascaded equalization filters (shelf and peak/notch filters) and compensate for leak gain among the frequency bands by estimation of gain influence and modification of gain parameters. The individual equalization filters are parameterized by center and band-edge frequencies and gains; and the preferred embodiment graphic equalizer cascades equalization filters in which filter band-edge frequencies coincide with adjacent equalization filter center frequencies. Leak gains are linearly approximated so that from a given set of desired gains at center frequencies, the peak/notch filter gains for the individual equalization filters can be computed with low complexity.

Preferred embodiment systems perform preferred embodiment methods with any of several types of hardware: digital signal processors (DSPs), general purpose programmable processors, application specific circuits, or systems on a chip (SoC) such as combinations of a DSP and a RISC processor together with various specialized programmable accelerators such as for FFTs and variable length coding (VLC). A stored program in an onboard or external (flash EEP)ROM or FRAM could implement the signal processing. Analog-to-digital converters and digital-to-analog converters can provide coupling to the real world, modulators and demodulators (plus antennas for air interfaces) can provide coupling for transmission waveforms, and packetizers can provide formats for transmission over networks such as the Internet.

2. Prototype Peak/Notch Filter

The preferred embodiment graphic equalizers will be cascades of two first-order shelf filters (one for the low frequencies end and one for the high frequencies) plus multiple second-order peak/notch filters for the various frequency bands in between.

Start with a second-order prototype filter which has an analog transfer function defined as follows in terms of the complex frequency $s=\sigma+j\omega$:

$$F_b(s)=N(s)/D(s)$$

with $$N(s)=s^2+2k^{1/2}\alpha\omega_0 s+\omega_0^2$$

$$D(s)=s^2+2k^{-1/2}\alpha\omega_0 s+\omega_0^2$$

where k and $\alpha$ are positive real parameters and $\omega_0$ is a center frequency. It is clear from the definition of $F_b(s)$:

$$|F_b(j0)|=|F_b(j\infty)|=1;$$

$$|F_b(j\omega_0)|=k;$$

$$\partial|F_b|/\partial\omega(j\omega_0)=0$$

and so $F_b(j\omega)$ has a peak/notch gain of k at a center frequency $\omega_0$.

Converting from the s plane to the z plane by the bilinear transform $$s=(1-z^{-1})/(1+z^{-1})$$

$$z^{-1}=(1-s)/(1+s)$$

maps the imaginary axis of the s plane (frequencies) to the unit circle of the z plane (exponential of frequencies). Indeed, $j\omega$ maps to $(1-\omega^2)/(1+\omega^2)-j2\omega/(1+\omega^2)$ which is the point $e^{-j\Omega}$ with $\cos\Omega=(1-\omega^2)/(1+\omega^2)$ and $\sin\Omega=2\omega/(1+^2)$ and thus $\omega=\tan(\Omega/2)$. This mapping provides a digital interpretation of the transformed filter by substitution:

$$F_b(z)=N(z)/D(z)$$

with $$N(z)=(1+k^{1/2}\alpha 2\omega_0+\omega_0^2)-2(1-\omega_0^2)z^{-1}+(1-k^{1/2}\alpha 2\omega_0+\omega_0^2)z^{-2}$$

$$D(z)=(1+k^{-1/2}\alpha 2\omega_0+\omega_0^2)-2(1-\omega_0^2)z^{-1}+(1-k^{-1/2}\alpha 2\omega_0+\omega_0^2)z^{-2}$$

Then dividing both N(z) and D(z) by $1+\omega_0^2$ and denoting the image of $j\omega_0$ as $e^{-j\Omega_0}$ gives $F_b(z)=N'(z)/D'(z)$ with:

$$N'(z)=(1+k^{1/2}\alpha \sin \Omega_0)-2 \cos \Omega_0 z^{-1}+(1-k^{1/2}\alpha \sin \Omega_0)z^{-2}$$

$$D'(z)=(1+k^{-1/2}\alpha \sin \Omega_0)-2 \cos \Omega_0 z^{-1}+(1-k^{-1/2}\alpha \sin \Omega_0)z^{-2}$$

where $\Omega_0$ represents the center frequency normalized by the Nyquist frequency in the digital domain. The frequency relation is:

$$\omega_0=\tan(\Omega_0/2)$$

That is $\omega=\tan(\Omega/2)$, where $\Omega$ ranges $-\pi<\Omega<\pi$.

The positive factor $\alpha$ in $F_b$ controls the bandwidth of the peak/notch filter where the bandwidth is defined in terms of frequencies at which the filter gain (in dB) equals one-half of the peak/notch gain k. In particular, let $\omega_l$ and $\omega_h$ be the lower and higher band-edge frequencies, respectively, so that by definition:

$$|F_b(j\omega_l)|=|F_b(j\omega_h)|=k^{1/2}$$

Solving for $\omega_l$ and $\omega_h$ from the definition of $F_b(j\omega)$ gives:

$$\omega_l^2=\omega_0^2(1+2\alpha^2-[(1+2\alpha^2)^2-1]^{1/2})$$

$$\omega_h^2=\omega_0^2(1+2\alpha^2+[(1+2\alpha^2)^2-1]^{1/2})$$

These two frequencies depend upon the bandwidth parameter $\alpha$ but not explicitly upon the gain k, and the two multipliers of $\omega_0^2$ are reciprocals.

In general, the bandwidth is expressed in octaves; thus let 2b be the octave bandwidth which leads to $$\omega_l=2^{-b}\omega_0 \text{ and } \omega_h=2^b\omega_0$$

Hence, solving for $\alpha$ by adding the foregoing two multipliers of $\omega_0^2$ gives:

$$\alpha=(2^b-2^{-b})/2$$

Note that $\alpha$ depends upon b but not upon k; this assures that $F_b(s)$ is gain-complementary. Indeed, if another transfer function, $F_{bc}(s)$, has gain 1/k at center frequency $\omega_0$ and octave bandwidth 2b, then $F_b(s) F_{bc}(s)=1$ for all s. This is one of the advantages of the use of band-edge frequencies $\omega_l$ and $\omega_h$ for bandwidth definition.

3. Prototype Shelf Filters

The first-order shelf filters for low and high frequencies have the following respective analog transfer functions:

$$F_l(s)=N_l(s)/D_l(s)$$

with $$N_l(s)=s+k^{1/2}\omega_0$$

$$D_l(s)=s+k^{-1/2}\omega_0$$

and $$F_h(s)=N_h(s)/D_h(s)$$

with $$N_h(s)=k^{1/2}s+\omega_0$$

$$D_h(s)=k^{-1/2}s+\omega_0$$

where k is the gain at the lowest/highest frequency, and $\omega_0$ is the band-edge frequency where the gain is $k^{1/2}$. More explicitly, $$|F_l(j0)|=k; |F_l(j\omega_0)|=k^{1/2}; \text{ and } |F_l(j\infty)|=1$$

$$|F_h(j0)|=1; |F_h(j\omega_0)|=k^{1/2}; \text{ and } |F_h(j\infty)|=k$$

As described for the peak/notch filters, converting from the s plane to the z plane by the bilinear transform $s=(1-z^{-1})/(1+z^{-1})$ maps the imaginary axis of the s plane to the unit circle of the z plane and thereby allows a digital interpretation for the transformed filter:

$$F_l(z)=N_l(z)/D_l(z)$$

with $$N_l(z)=(1+k^{1/2}\tan(\Omega_0/2))-(1-k^{1/2}\tan(\Omega_0/2))z^{-1}$$

$$D_l(z)=(1+k^{-1/2}\tan(\Omega_0/2))-(1-k^{-1/2}\tan(\Omega_0/2))z^{-1}$$

and $$F_h(z)=N_h(z)/D_h(z)$$

with $$N_h(z)=(k^{1/2}+\tan(\Omega_0/2))-(k^{1/2}-\tan(\Omega_0/2))z^{-1}$$

$$D_h(z)=(k^{-1/2}+\tan(\Omega_0/2))-(k^{-1/2}-\tan(\Omega_0/2))z^{-1}$$

4. Preferred Embodiment Cascade

A preferred embodiment graphic equalizer can be realized by cascading peak/notch filters plus low and high frequency shelf filters. Denote the overall transfer function by F(s), then $$F(s)=F_l(s)F_h(s)\Pi_{1\leq n\leq N}F_b^{(n)}(s)$$

where N is the number of peak/notch filters each of which has a transfer function $F_b^{(n)}(s)$ with peak/notch gain $k^{(n)}$ at its center frequency. And the low and high frequency shelf filters have transfer functions $F_l(s)$ and $F_h(s)$, respectively, with gains $k^{(l)}$ and $k^{(h)}$ at s=j0 and j$\infty$, respectively. Thus the overall response of the cascade at the mth center frequency, $\omega_0^{(m)}$, is:

$$F(j\omega_0^{(m)})=F_l(j\omega_0^{(m)}) F_h(j\omega_0^{(m)})\Pi_{1\leq n\leq N}F_b^{(n)}(j\omega_0^{(m)})$$

The first preferred embodiment cascade has the N center frequencies $\omega_0^{(1)}, \omega_0^{(2)}, \ldots, \omega_0^{(N)}$ equally spaced(by b octaves) in the analog domain and with each peak/notch filter's two band-edge frequencies at the two neighboring filters' center frequencies. And each shelf filter has its band-edge frequency at the neighboring peak/notch filter's center frequency. FIG. 1 illustrates the individual filter responses for an example when all of the gains, $k^{(m)}$ are equal to G dB for a G greater than 0.

It is important to note that the frequency allocation of the first preferred embodiment is determined in the analog domain. This design method is an alternative to that of Bristow-Johnson (cited in the background) in which the design specification for the bandwidth is made totally in the digital domain. The preferred embodiment method will cause the actual center frequencies in the digital domain to not be placed at the same octave distances, but closer together for the higher frequency filters due to the frequency warping (nonlinearity) of the bilinear transform: $\omega=\tan(\Omega/2)$.

5. Gain Leakage Compensation

The preferred embodiment cascade has "leak gains" which are to be compensated with low-complexity computations. More explicitly, first let $g_n^{(m)}$ denote the gain of the nth peak/ notch filter at the center frequency of the mth peak/notch filter; that is, for m, n=1, 2, ..., N:

$$g_n^{(m)} = |F_b^{(n)}(j\omega_0^{(m)})|$$

Similarly, let $g_l^{(m)}$ and $g_h^{(m)}$ denote the gain of the low and high shelf filters, respectively, at the center frequency of the mth peak/notch filter; that is, for m=1, 2, ..., N:

$$g_l^{(m)} = |F_l(j\omega_0^{(m)})|$$

$$g_h^{(m)} = |F_h(j\omega_0^{(m)})|$$

Thus the $g_l^{(m)}$, $g_h^{(m)}$, and $g_n^{(m)}$ for n≠m are the gains which distort the mth peak/notch filter's gain and constitute the "leak gains" from the other filters.

Recall that the preferred embodiment cascade has the center frequencies separated by multiples of b octaves: $\omega_0^{(n)} = 2^{b(n-m)}\omega_0^{(m)}$; thus with the convenient notation $S_x = 2^x - 2^{-x}$ (so $S_0 = 0$ and $S_{-x} = -S_x$):

$$(g_n^{(m)})^2 = (S_{b(n-m)}^2 + 4\alpha^2 k^{(n)})/(S_{b(n-m)}^2 + 4\alpha^2/k^{(n)})$$

$$= (S_{b(n-m)}^2 + S_b^2 k^{(n)})/(S_{b(n-m)}^2 + S_b^2/k^{(n)})$$

where the section 2 computation of $\alpha^2$ in terms bandwidth was used. The special cases of m=n and m=n±1 give the expected $g_n^{(n)} = k^{(n)}$ and $g_n^{(n\pm 1)} = (k^{(n)})^{1/2}$, respectively.

Analogously for the low and high frequency shelf filters, whose band-edge frequencies have been set equal to the center frequencies of $F_b^{(1)}$ and $F_b^{(N)}$, respectively:

$$(g_l^{(m)})^2 = \{(\omega_0^{(m)})^2 + (\omega_0^{(1)})^2 k^{(l)}\}/\{(\omega_0^{(m)})^2 + (\omega_0^{(1)})^2/k^{(l)}\}$$

$$= (2^{2b(m-1)} + k^{(l)})/(2^{2b(m-1)} + 1/k^{(l)})$$

$$(g_h^{(m)})^2 = \{(\omega_0^{(m)})^2 + (\omega_0^{(N)})^2 k^{(h)}\}/\{(\omega_0^{(m)})^2 + (\omega_0^{(N)})^2/k^{(h)}\}$$

$$= (2^{2b(N-m)} + k^{(h)})/(2^{2b(N-m)} + 1/k^{(h)})$$

And the special cases of m=1 and m=N give the expected $g_l^{(1)} = (k^{(l)})^{1/2}$ and $g_h^{(N)} = (k^{(h)})^{1/2}$.

Now for analytic convenience, convert all of the foregoing to dB by taking 20 log||. In particular, first define:

$$G^{(m)} = 20 \log |F(j\omega_0^{(m)})|$$

$$G_n^{(m)} = 20 \log |F_b^{(n)}(j\omega_0^{(m)})| = 20 \log |g_n^{(m)}|$$

$$G_l^{(m)} = 20 \log |F_l(j\omega_0^{(m)})| = 20 \log |g_l^{(m)}|$$

$$G_h^{(m)} = 20 \log |F_h(j\omega_0^{(m)})| = 20 \log |g_h^{(m)}|$$

Thus the overall response at the center frequencies is expressed as:

$$G^{(m)} = G_l^{(m)} + G_h^{(m)} + \sum_{1 \leq n \leq N} G_n^{(m)}$$

Note that the shelf filter gains are not affected by any leak gain because the limit frequencies of j0 and j∞ are an infinite number of octaves from the peak/notch filters; that is, $|F(j0)| = k^{(l)}$ and $|F(j\infty)| = k^{(h)}$.

Further, let $K^{(n)}$ be the peak/notch gain in dB of the peak/notch filters at their center frequencies, $\omega_0^{(n)}$; that is, $K^{(n)} = 20 \log |k^{(n)}|$.

Now, introduce a non-linear function $h_m(x)$ which essentially separates the octave and gain parameters of $g_n^{(m)}$ in the dB domain and is defined by:

$$h_m(x) = 10 \log\{(S_{mb}^2 + S_b^2 10^{x/20})/(S_{mb}^2 + S_b^2/10^{-x/20})\}$$

From the definitions it is clear that:

$$h_0(x) = x$$

$$h_1(x) = x/2$$

$$h_{-m}(x) = h_m(x)$$

$$G_n^{(m)} = h_{|n-m|}(K^{(n)})$$

And the overall cascade gain is then expressed as:

$$G^{(m)} = G_l^{(m)} + G_h^{(m)} + \sum_{1 \leq n \leq N} h_{|n-m|}(K^{(n)})$$

Thus the leakage gain problem translates to the problem of finding a set of individual peak/notch filter gains $K^{(n)}$ so that for each m the overall gain, $G^{(m)}$, has the input desired value, say $G_d^{(m)}$, at center frequency, $\omega_0^{(m)}$. That is, for desired shelf filter gains $G_l^{(m)}$ and $G_h^{(m)}$ plus desired center frequency gains N-vector $G_d^{(m)}$, preferred embodiment graphic equalizers find an N-vector of individual peak/notch filter center frequency gains $K^{(n)}$ so that $$\sum_{1 \leq n \leq N} h_{|n-m|}(K^{(n)}) = G_d^{(m)} - G_l^{(m)} - G_h^{(m)} \quad \text{for } m = 1, 2, \ldots, N.$$

and apply these center frequency gains to the individual peak/notch filters together with the desired shelf filter gains to the shelf filters.

For low computational complexity, preferred embodiment graphic equalizers approximate the non-linear functions $h_m(x)$ for m≧2 by a linear functions (note that $h_0(x) = x$ and $h_1(x) = x/2$ are already linear functions):

$$h_m(x) \approx d_m x \text{ for } -K_0 \leq x \leq +K_0 \text{ with a constant } K_0$$

Thus $d_m = h_m(K_0)/K_0$.

Hence, the leak-gain problem becomes linear:

$$HK = G$$

where the two N-vectors K and G are defined as:

$$K = \begin{bmatrix} K^{(1)} \\ K^{(2)} \\ \vdots \\ K^{(N)} \end{bmatrix}$$

$$G = \begin{bmatrix} G_d^{(1)} - G_l^{(1)} - G_h^{(1)} \\ G_d^{(2)} - G_l^{(2)} - G_h^{(2)} \\ \vdots \\ G_d^{(N)} - G_l^{(N)} - G_h^{(N)} \end{bmatrix}$$

and the symmetric N×N Toeplitz matrix H is:

$$H = \begin{bmatrix} 1 & 1/2 & d_2 & \cdots & d_{N-1} \\ 1/2 & 1 & 1/2 & \ddots & \vdots \\ d_2 & 1/2 & 1 & \ddots & d_2 \\ \vdots & \ddots & \ddots & \ddots & 1/2 \\ d_{N-1} & \cdots & d_2 & 1/2 & 1 \end{bmatrix}$$

The Levinson algorithm may be used to efficiently solve HK=G for K from the given H and G.

Figure 3:
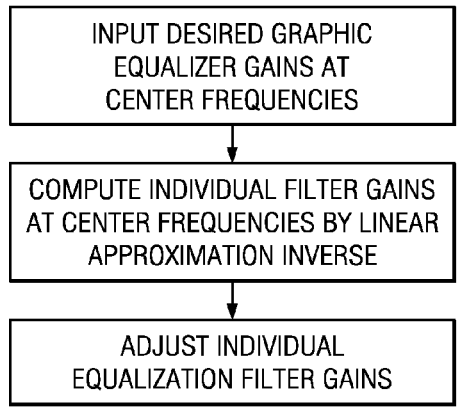
FIG. 3 is a flow diagram.
Figure 4:
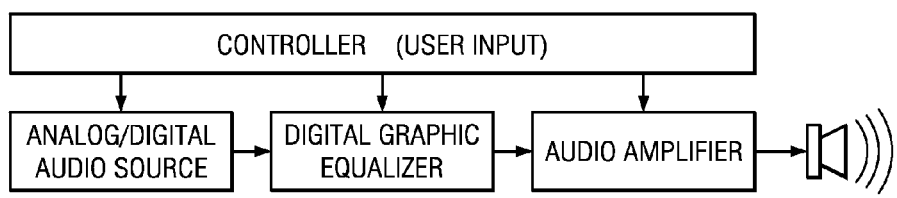
FIG. 4 shows a system.

Thus the preferred embodiment graphic equalizer provides a set of center frequencies (at equal octave separations in the analog domain) with user adjustable desired overall gains at these frequencies. The filter is implemented as a cascade of low and high shelf filters plus second order peak/notch filters whose center and band-edge frequencies coincide with the set of center frequencies and with gains K determined by a processor/controller solving HK=G with G input desired overall gains at the center frequencies. Once the octave separation of the center frequencies, b, and the linearity approximation range, $K_0$, are picked, the elements of H are determined by $d_m = h_m(K_0)/K_0$, and the inverse of H can be pre-computed. FIG. 3 is a flow diagram.

6. Experimental Results

A preferred embodiment graphic equalizer was compared to known designs for the same center frequencies and desired gains; FIGS. 2a-2d show the results. In more detail, consider a graphic equalizer with a set of seven center frequencies, $\omega_0^{(1)}, \omega_0^{(2)}, \ldots, \omega_0^{(7)}$, with separations by one octave in the analog domain (i.e., $\omega_0^{(n+1)}/\omega_0^{(n)}=2$ and b=1) and normalized by taking $\omega_0^{(7)}=1.0$. The desired gains (in dB) are $G_d^{(1)}=-6$, $G_d^{(2)}=-6$, $G_d^{(3)}=-6$, $G_d^{(4)}=+3$, $G_d^{(5)}=-6$, $G_d^{(6)}=0$, $G_d^{(7)}=0$. Also, presume the low and high frequency shelf filter gains are 0. These design criteria are illustrated by the points in FIG. 2a.

Figure 2A:
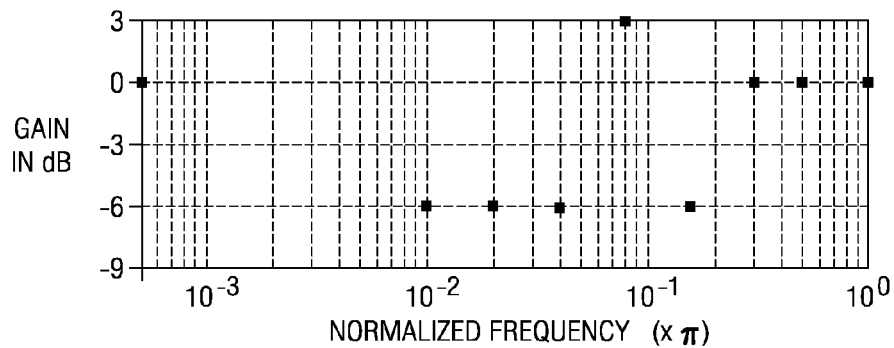
FIGS. 2a-2d illustrate experimental results.
Figure 2B:
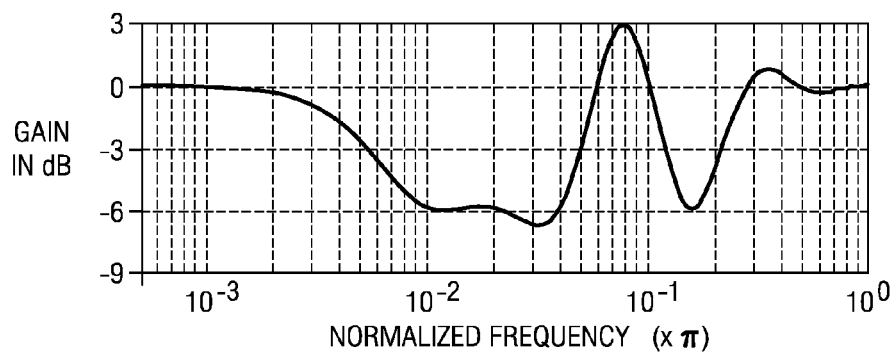

In the digital domain the center frequencies are $\Omega_0^{(n)}=(2)$ arctan$(2^{n-7})$. The parameter $\alpha=(2^b-2^{-b})/2=0.75$. Taking the linearity range $K_0=12$ gives the $d_m$ values as $d_0=1.0000$, $d_1=0.5000$, $d_2=0.1641$, $d_3=0.0456$, $d_4=0.0117$, $d_5=0.0030$, and $d_6=0.0007$. FIG. 2b shows the graphic equalizer response.

Figure 2C:
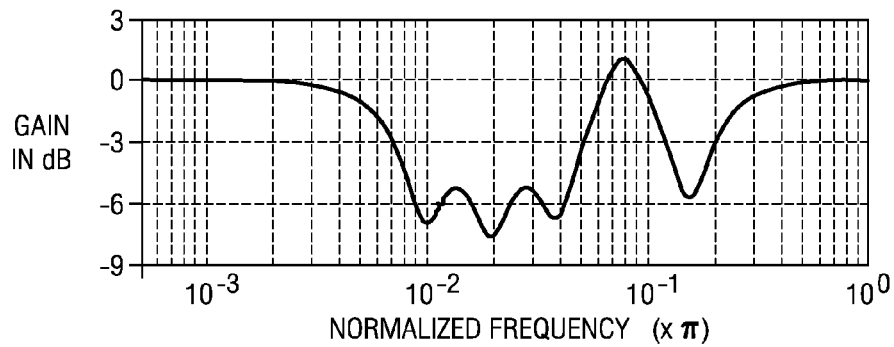
Figure 2D:
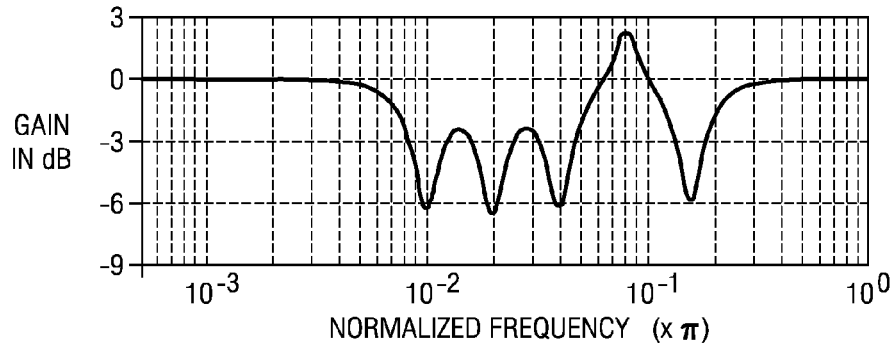

For comparison, a cascade of equalization filters was implemented with filters as in Bristow-Johnson (cited in the background) which have the same center frequencies but do not use any leak gain compensation. FIG. 2c shows the response; note that at $\Omega=0.08\pi$ the gain climbs only up to +1 dB, whereas it should be +3 dB according to the specification (FIG. 2a). This discrepancy is due to the leak gain from the neighboring filters which have gains set to −6 dB. A second design attempted to reduce the leak by narrowing the bandwidth of the filters, and this new cascade came up with the results shown in FIG. 2d. But the curve in the $\Omega$ range $0.01\pi$ to $0.04\pi$ changes a lot between the specified center frequencies. In contrast, the preferred embodiment gives a more peak-gain-exact and smooth response curve.

7. Modifications

Various modifications of the preferred embodiment graphic equalizer can be made while retaining the feature of leak gain compensation.

For example, the linear approximation of the functions $h_m(x)$ could use the derivative of $h_m(x)$ at x=0 as the slope $d_m$ and thereby avoid the parameter $K_0$; indeed, $$\partial h_m/\partial x(0) = S_b^2/(S_{mb}^2+S_b^2) = 1/(S_{mb}^2/S_b^2+1)$$

For m=2 and b=1, $\partial h_2/\partial x(0)=1/(S_2^2/S_1^2+1)=0.1379$, which approximates the 0.1641 derived from $K_0=12$. Similarly, for m=3, $\partial h_3/\partial x(0)=0.0350$ which approximates the 0.0456 derived from $K_0=12$.

Other modifications would include a method that improves the accuracy of the linear approximation for $h_m(x)$. The steps are as follows:

(1) Solve the equation, $K_1=[K_1^{(1)} K_1^{(2)} \ldots K_1^{(N)}]^T = H^{-1}G$, where $^T$ indicates transpose. Note that H has been defined using the approximated with $d_m=h_m(K_0)/K_0$.

(2) Using $K_1$, replace the linear-approximated matrix H with $H_{new}$ as follows:

$$H_{new} = \begin{bmatrix} 1 & 1/2 & d_2^{(2)} & \cdots & d_{N-1}^{(N)} \\ 1/2 & 1 & 1/2 & \ddots & \vdots \\ d_2^{(0)} & 1/2 & 1 & \ddots & d_2^{(N)} \\ \vdots & \ddots & \ddots & \ddots & 1/2 \\ d_{N-1}^{(0)} & \cdots & d_2^{(N-2)} & 1/2 & 1 \end{bmatrix},$$

where $d_m^{(n)} = h_m(K_1^{(n)})/K_1^{(n)}$.

(3) Solve the new simultaneous equation, $H_{new}K_{new}=G$.

Note that usually $H_{new}$ will be more accurate than H, since it is likely that $K_1^{(n)}$ is closer than $K_0$ to the "ideal solution" (without linear approximation) that satisfies $$\sum_{1 \leq n \leq N} h_{|n-m|}(K^{(n)}) = G_d^{(m)} - G_l^{(m)} - G_h^{(m)}.$$

The disadvantage of this new method is its larger computational complexity. It requires solution of the simultaneous equation twice. Also, for the second simultaneous equation, the Levinson algorithm cannot be used because $H_{new}$ is not symmetric Toeplitz and more computationally expensive algorithm such as Gauss's algorithm or the Conjugate Gradient Algorithm will be used instead.

What is claimed is:

1. A digital graphic equalizer, comprising:
   (a) a cascade of peak/notch filters $F^{(1)}, F^{(2)}, \ldots, F^{(N)}$ where N is an integer greater than 1, and each of said filters has a transfer function which is a bilinear transform of an analog transfer function of the form $$(s^2+2K^{1/2}\alpha\omega_0 s+\omega_0^2 s^2)/(s^2+2K^{-1/2}\alpha\omega_0 s+\omega_0^2 s^2)$$

with K a gain, $\alpha$ a positive constant, and $\omega_0$ an analog center frequency;
   (b) wherein said center frequency corresponding to $F^{(j)}$ is equal to a band-edge frequency corresponding to $F^{(j+1)}$ and/or $F^{(j-1)}$ for j=1, 2, . . . N, and wherein $\alpha$ is the same for all of said filters.

2. The equalizer of claim 1, further comprising:
   (a) a low frequency shelf filter $F_l$ coupled to said cascade, wherein $F_l$ has a transfer function which is a bilinear transform of an analog transfer function of the form $$(s+K^{1/2}\omega_0)/(s+K^{-1/2}\omega_0)$$

with K a gain and $\omega_0$ an analog band-edge frequency; and
   (b) a high frequency shelf filter $F_h$ coupled to said cascade, wherein said $F_h$ has a transfer function which is a bilinear transform of an analog transfer function of the form $(K^{1/2}s+\omega_0)/(K^{-1/2}s+\omega_0)$ with K a gain and $\omega_0$ an analog band-edge frequency;
  (c) wherein for $F_l$ the band-edge frequency equals the center frequency for $F^{(1)}$ and for $F_h$ the band-edge frequency equals the center frequency for $F^{(N)}$.

3. The equalizer of claim 1, further comprising:
  (a) a controller coupled to said cascade, said controller operable to compute center frequency filter gains for said peak/notch filters with leak gain compensation from input desired center frequency filter gains for said peak/notch filters.

4. The equalizer of claim 3, wherein:
  (a) said leak gain compensation uses a linear approximation.

5. The equalizer of claim 3, wherein:
  (a) said leak gain compensation uses an iterated linear approximation.

6. A method of digital signal processor for graphic equalizer control, comprising:
  (a) receiving a plurality of desired center frequency filter gains for a cascade of equalization filters, each of said filters has a transfer function which is a bilinear transform of an analog transfer function of the form $(s^2+2K^{1/2}\alpha\omega_0 s+\omega_0^2 s^2)/(s^2+2K^{-1/2}\alpha\omega_0 s+\omega_0^2 s^2)$ with K a gain, $\alpha$ a positive constant, and $\omega_0$ an analog center frequency, wherein said center frequency corresponding to the cascade of equalization filters is equal to a band-edge frequency corresponding to $F^{(j+1)}$ and/or $F^{(j-1)}$ for j=1, 2, ... N, and wherein $\alpha$ is the same for all of said filters;
  (b) converting said desired center frequency filter gains into compensated center frequency filter gains for said cascade, wherein said converting compensates for leak gains.

7. The method of claim 6, wherein:
  (a) said leak gains includes leak gains from low frequency and high frequency shelf filters having desired low frequency and high frequency gains.

8. The method of claim 6, wherein:
  (a) said converting uses a linear approximation.

* * * * *